United States Patent [19]

Ballato

[11] 4,388,146
[45] Jun. 14, 1983

[54] ANALOG CORRECTION OF QUARTZ RESONATOR ANGLE OF CUT

[75] Inventor: Arthur Ballato, Long Branch, N.J.

[73] Assignee: The United States of America as represented by the Secretary of the Army, Washington, D.C.

[21] Appl. No.: 361,655

[22] Filed: Mar. 25, 1982

[51] Int. Cl.³ .................... B44C 1/22; C03C 15/00; C03C 25/06
[52] U.S. Cl. ................... 156/626; 156/643; 156/654; 156/663; 156/345; 219/121 LM
[58] Field of Search ............. 156/626, 627, 654, 655, 156/663, 643, 345; 219/121 L, 121 LM

[56] References Cited

U.S. PATENT DOCUMENTS

| | | | |
|---|---|---|---|
| 3,489,564 | 1/1970 | Schaefer | 96/36 |
| 3,694,677 | 9/1972 | Guttwein et al. | 310/9.6 |
| 3,803,774 | 4/1974 | Miller | 51/283 |

OTHER PUBLICATIONS

Proceedings of the 30th Annual Symposium on Frequency Control, (1976) pp. 259–263, "A Method of Angle Correction", D. Husgen, et al.
Proceedings of 1980 IEEE Ultrasonics Symposium, "What Saw Can Learn From Baw . . . ", T. Lukaszek, et al.

*Primary Examiner*—William A. Powell
*Attorney, Agent, or Firm*—Nathan Edelberg; Jeremiah G. Murray; Edward Goldberg

[57] ABSTRACT

The angle of cut of a quartz resonator blank is corrected by a photolytic etching technique whereby an intensity gradient of photon energy is developed across the surface crystal blank which is to be corrected. The intensity gradient is generated by means of a lens system located intermediate a photon source and the crystal blank, the surface of which has been treated with a photolytic etchant. The lens system includes at least one lens having a region of variable transmissivity of photon energy so that the amount of photon energy impinging on the crystal determines the depth of surface erosion. Additionally, the etching operation is controlled by means of a programmed digital computer which controls the contour of the face being etched upon receiving feedback information from X-ray apparatus which examines and monitors the etching for providing closed-loop control.

18 Claims, 5 Drawing Figures

ANALOG CORRECTION OF QUARTZ RESONATOR ANGLE OF CUT

The invention described herein may be manufactured, used and licensed by or for the Government for governmental purposes without the payment to me of any royalties thereon.

CROSS REFERENCE TO RELATED APPLICATION

This application is related to the following application which is assigned to the assignee of the present invention: U.S. Ser. No. 361,657, entitled, "Quartz Resonator Angle Correction", filed on Mar. 25, 1982, in the name of Arthur Ballato, the inventor of the subject invention.

BACKGROUND OF THE INVENTION

The invention relates generally to quartz crystal resonators utilized for frequency controlled apparatus and the like and more particularly to a technique for accurately correcting the angle of cut of quartz crystal resonator blanks or plates.

It is well known that quartz crystal plates utilized for frequency control apparatus normally cannot be cut with sufficient accuracy where high precision applications are intended. Thus, following the initial cutting operation, the crystal blanks must have their orientation angles or angles of cut corrected prior to their installation in the respective equipment with which they are to be utilized.

In U.S. Pat. No. 3,803,774, entitled, "Technique For Correcting the Crystallo-Graphic Orientation Angle of Crystals by the Formation of Mesas and Double Face Lapping", issued to A. J. Miller on Apr. 16, 1974, there is disclosed a technique for correcting the angles of cut of quartz plates which involves first the formation of mesas by various methods such as etching, machining or mounting a chip on the surfaces of the plate, followed by a double-face lapping operation until the mesas are removed, at which point the angle of cut has been changed by the desired amount and the lapped upper and lower surfaces of the plate are substantially parallel. An inherent problem, however, arises in the masking of quartz plates during etching due to the fact that the masking material is attacked by the etchant and due to the complexity of the method of applying and removing the masking materials themselves. Various tapes, photoresists and solder-resists have been utilized, but to date none has proved to be satisfactory. Chemical and ion etching has been suggested in U.S. Pat. No. 3,694,677, entitled, "VHF-UHF Piezoelectric Resonators", issued to G. K. Guttwein, et al. on Sept. 26, 1972. In U.S. Pat. No. 3,489,564, entitled, "Photolytic Etching of Silicon Dioxide", issued to D. L. Schaefer, on Jan. 13, 1970, there is disclosed a process whereby the etching of a predetermined pattern for decorative and optical purposes is achieved by exposing the surface of the body to be etched with radiation which has been previously treated by a photolytically decomposable liquid.

It is an object of the present invention, therefore, to provide an improved technique for correcting the angle of cut of a quartz resonator blank.

It is another object of the present invention to provide a technique for correcting the angle of cut of a quartz resonator plate or blank which substantially eliminates the need for the formation of mesas and subsequent lapping operations.

It is a further object of the invention to provide a photolytic etching technique for correcting the angle of cut of a quartz crystal resonator blank.

And it is yet another object of the invention to provide an automated photolytic etching correction process for correcting the angle of cut of a quartz resonator blank or plate.

SUMMARY

These and other objects are achieved in accordance with the present invention by optically generating an intensity gradient across the major faces of a quartz crystal resonator blank which has been treated by a photolytic etchant. The apparatus includes a photon source of a predetermined wavelength and lens means having a variable transmissivity in the direction across the face of the crystal resonator blank, whereby the rate of erosion depends upon the intensity of the photon energy impinging on the surface being etched. The photolytic etching process is further controlled by means of a programmed digital computer which has a feedback control provided by X-ray apparatus which is controlled by the computer, but is operable to monitor and examine the crystal blank during the etching process, thereby making the equipment compatible for production line processing.

DESCRIPTION OF THE PREFERRED EMBODIMENTS

The present invention is directed to the method and apparatus for providing a quartz crystal resonator angle correction which is adapted to eliminate or at least minimize the necessity of producing a mesa together with the subsequent double-faced lapping operation heretofore required. Additionally, the present invention is designed for mass production operation including an automated correction process which is adapted to correct not only a quartz crystal along a single angle of rotation, but also to doubly rotated cuts.

Figure 1:
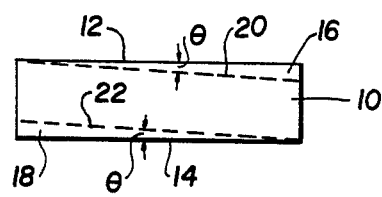
FIG. 1 is a side plan view of a quartz crystal resonator blank whose top and bottom major faces are to be corrected.

Considering now the drawings and more particularly FIG. 1, reference numeral 10 denotes a quartz crystal resonator blank or plate having a pair of generally parallel major surfaces or faces 12 and 14 whose angle of cut are to be corrected by an angle $\theta$ by the removal of wedge shaped sections 16 and 18 therefrom with inclined upper and lower faces 20 and 22 remaining following the correction process. In the prior art, the angle $\theta$ has been achieved, for example, by the formation of mesas on the major surfaces 12 and 14 followed by a double face lapping machine operation, which results in the formation of the inclined surfaces 20 and 22. The present invention contemplates a photolytic etching technique whereby an intensity gradient of photon energy is produced across the faces 12 and 14 of the crystal 10.

Figure 2:
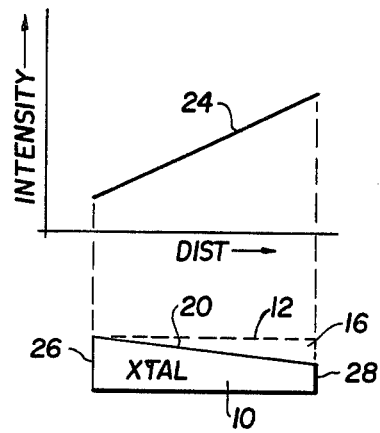
FIG. 2 is a diagram including a graph illustrative of a light intensity curve for photolytic etching of a crystal blank in accordance with the subject invention.

Referring to FIG. 2, a light intensity curve 24 is shown plotted with respect to distance across the face 12 of the crystal 10. The curve 24 furthermore indicates that the intensity is adapted to increase substantially linearly from the left hand edge 26 of the crystal 10 to the right hand edge 28. Assuming that the rate of etching is directly proportional to intensity, then a wedge-shaped section 16 will be etched leaving the surface 20. If the etchant, not shown, on the surface 12 does not provide for a linear etching rate in response to intensity, then the curve 24 is modified accordingly.

Figure 3:
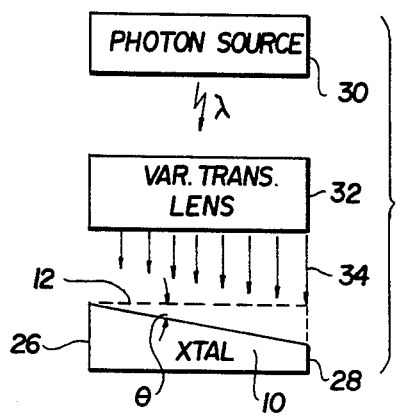
FIG. 3 is a block diagram illustrative of a photolytic etching system in accordance with the subject invention.

A relatively simple implementation of a photo-optic system which is adapted to generate an intensity gradient such as shown in FIG. 2 across the surface 12 is shown in FIG. 3. The system is comprised of a photon source 30 which may be, for example, a laser emitting light (photon energy) of a wavelength $\lambda$ which is projected to the surface 12 through a lens system having a variable transmissivity. In FIG. 3, the lens system is shown comprised of a single lens element 32 which outputs an intensity gradient diagrammatically shown by the arrows 34 whose length progressively increases from the crystal edge 26 to the edge 28. When desirable, the photon source 30 may consist of a Xenon lamp and the lens 32 can be configured in the form of a Fresnel lens, a device well known to those skilled in the art of optics.

Figure 4:
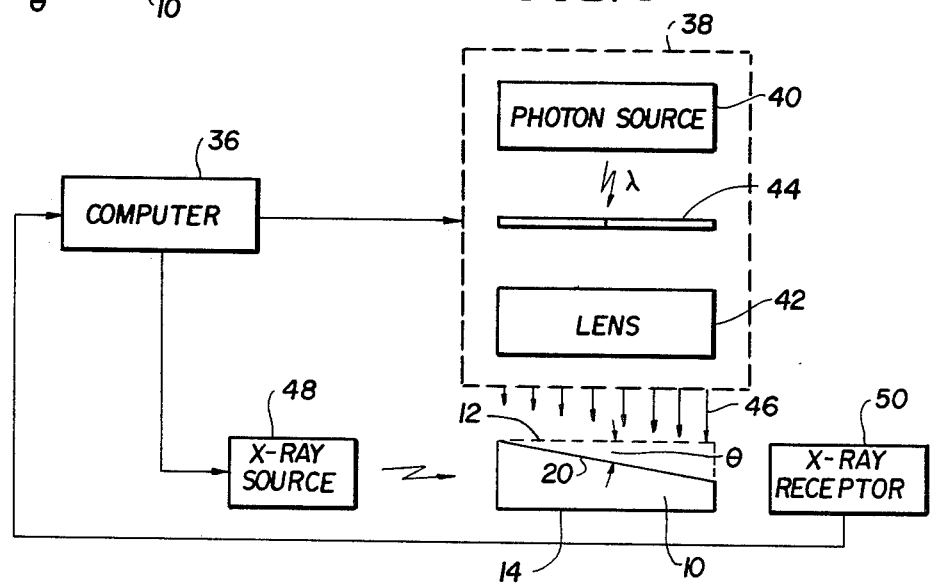
FIG. 4 is a block diagram illustrative of a computer controlled system for providing photolytic etching in accordance with the subject invention.

Apparatus for carrying out an automated correction of the angle of cut of quartz resonator blanks is shown in FIG. 4 and includes digital computer apparatus 36 implemented, for example, by a mini-computer or a microprocessor which is programmed to control a photolytic etching system 38 consisting of a photon source 40, a lens system 42, and a shuttering arrangement 44, all of which are adapted to operate together under the control of the computer 36 for generating a photo intensity gradient 46. The etching apparatus 38, moreover, can be duplicated when desired for simultaneously photolytically etching the opposite face 14 of the crystal 10, since both faces are normally corrected. Such a configuration lends itself to production line processing.

Accordingly, the embodiment illustrated in FIG. 4 is provided merely for purposes of simplification. In order for the correction process to be automated by the computer 36, X-ray apparatus including an X-ray source 48 and an X-ray receptor 50 is provided adjacent the crystal blank 10 for examining the crystal both before, during and after photolytic etching of the face 12 in order that the computer 36 can be constantly updated as to the present state of etching and to thereafter further making the necessary calculations required to control the contour of the resulting surface 20. This is accomplished, for example, by the computer 36 controlling the operation of the X-ray source 48 whereupon the X-ray receptor 50 feeds information back to the computer so as to form a closed loop feedback system.

Figure 5:
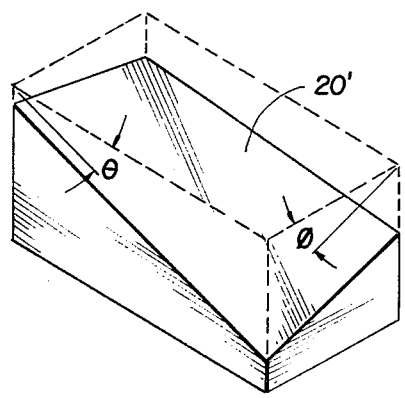
FIG. 5 is a perspective view of the crystal resonator blank having a double angle correction applied to one surface thereof.

While the intensity gradient 46 typically comprises a monotonic variation in intensity, meaning that but a single angle $\theta$ of correction is provided, a double angle correction for the angles $\theta$ and $\phi$ as shown in FIG. 5 can easily be provided by properly programming the computer 36. A resultant correction of a doubly rotated cut is shown in FIG. 5 with the resulting corrected surface 20' being provided. Following the photolytic etching techniques described above, a conventional chemical polishing step with $NH_4.HF_2$ can, when desired, be carried out.

Thus having shown and described what is at present considered to be the preferred method and apparatus for carrying out the subject invention, modifications and alterations will readily occur to those skilled in the art. Accordingly, the foregoing has been set forth by way of illustration and not limitation and therefore all modifications and variations coming within the spirit and scope of the invention as defined by the appended claims are herein meant to be included.

What is claimed is:

1. The method of correcting the angle of cut of a quartz crystal resonator blank including at least one major face treated with a photolytic etchant and which substantially eliminates the need for forming a mesa and subsequent machine lapping thereof to provide an inclined corrected angle surface on said blank, comprising the steps of:
    (a) locating an uncorrected resonator blank in etching apparatus;
    (b) generating a photon energy source; and
    (c) directing photon energy from said source to said major face and generating an intensity gradient of photon energy across the surface of said major face causing a gradient of surface erosion to occur by photolytic etching which thereby changes the angle of cut of said resonator blank.

2. The method as defined by claim 1 wherein said photo intensity gradient comprises a substantially linear gradient in a selected direction across said major face.

3. The method as defined by claim 1 wherein said resonator blank includes another major face opposite said at least one major face and additionally including step (c) on said another major face.

4. The method as defined by claim 1 wherein said photo intensity gradient is computer controlled.

5. The method as defined by claim 4 and additionally including the step of sensing the countour of the etched surface of said major face and feeding information back to a computer which thereby provides control of said photo intensity gradient.

6. The method as defined by claim 5 wherein said step of sensing includes sensing with X-ray apparatus.

7. Apparatus for correcting the angle of cut of a quartz crystal resonator blank having a pair of major faces one of which, at least, is treated with a photolytic etchant, comprising:
    photolytic etching apparatus including means for generating a photon beam;
    means for directing said photon beam to said one of said pair of major faces; and
    means for generating a photo intensity gradient across the surface of said one major face for eroding a selected portion of said major face in a substantially uniform manner which thereby changes the angle of cut of said resonator blank.

8. The apparatus as defined by claim 7 wherein said means for generating said photo intensity gradient comprises lens means.

9. The apparatus as defined by claim 8 wherein said lens means comprises a lens system including at least one variable transmissivity lens.

10. The apparatus as defined by claim 8 wherein said lens means includes a Fresnel lens.

11. The apparatus as defined by claim 7 wherein said photo intensity gradient comprises a substantially linear gradient.

12. The apparatus as defined by claim 7 and additionally including automatic control means for controlling said photo intensity gradient.

13. The apparatus as defined by claim 12 wherein said control means comprises computer apparatus.

14. The apparatus as defined by claim 13 wherein said computer apparatus comprises a programmed digital computer.

15. The apparatus as defined by claim 13 and additionally including means for sensing the contour of the etchant surface of said major face and feeding information relative thereto back to said computer apparatus whereby said computer apparatus further controls the etching of said major face in a feedback control loop.

16. The apparatus as defined by claim 15 wherein said means for sensing the etching contour comprises radiant energy apparatus.

17. The apparatus as defined by claim 16 wherein said radiant apparatus comprises X-ray apparatus.

18. The apparatus as defined by claim 17 wherein said X-ray apparatus includes means for being controlled by said computer apparatus.

* * * * *